US009954635B2

(12) United States Patent
Ferguson et al.

(10) Patent No.: US 9,954,635 B2
(45) Date of Patent: *Apr. 24, 2018

(54) VARIABLE RATE CODING FOR ENABLING HIGH PERFORMANCE COMMUNICATION

(71) Applicant: Intel Corporation, Santa Clara, CA (US)

(72) Inventors: Dennis D. Ferguson, Indian Harbour Beach, FL (US); James A. Proctor, Jr., Indialantic, FL (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/054,045

(22) Filed: Feb. 25, 2016

(65) Prior Publication Data

US 2016/0173220 A1    Jun. 16, 2016

Related U.S. Application Data

(63) Continuation of application No. 13/859,254, filed on Apr. 9, 2013, now Pat. No. 9,306,703, which is a
(Continued)

(51) Int. Cl.
H04B 7/216 (2006.01)
H04J 13/16 (2011.01)
(Continued)

(52) U.S. Cl.
CPC .......... *H04J 13/16* (2013.01); *G11B 20/1833* (2013.01); *H03M 13/35* (2013.01); *H04B 7/2631* (2013.01); *H04L 1/0007* (2013.01);

*H04L 1/0025* (2013.01); *H04L 1/0041* (2013.01); *H04L 1/0042* (2013.01); *H04L 1/0057* (2013.01); *H04L 1/1816* (2013.01);
(Continued)

(58) Field of Classification Search
None
See application file for complete search history.

(56) References Cited

U.S. PATENT DOCUMENTS 5,546,549 A    8/1996  Barrett et al.
5,710,756 A    1/1998  Pasternak et al.
(Continued)

FOREIGN PATENT DOCUMENTS

JP    05260022      10/1993
JP    05-327772     12/1993
(Continued)

OTHER PUBLICATIONS

Office Action from U.S. Appl. No. 131284,070 dated Jul. 26, 2012, 6 pages.
(Continued)

*Primary Examiner* — Rebecca E Song
(74) *Attorney, Agent, or Firm* — Womble Bond Dickinson (US) LLP

(57) ABSTRACT

A protocol for optimizing the use of coded transmissions such as over wireless links. In this technique, interframes are split into segments selected to be an optimum size according to transmission characteristics of the radio channel. The inverse process is applied at the receiver. Using this scheme, segments containing erroneous data may be resent.

15 Claims, 8 Drawing Sheets

Related U.S. Application Data continuation of application No. 13/284,070, filed on Oct. 28, 2011, now Pat. No. 8,437,329, which is a continuation of application No. 12/917,008, filed on Nov. 1, 2010, now Pat. No. 8,068,474, which is a continuation of application No. 12/563,466, filed on Sep. 21, 2009, now Pat. No. 7,826,437, which is a continuation of application No. 09/263,358, filed on Mar. 5, 1999, now Pat. No. 7,593,380.

(51) Int. Cl.

| | | |
|---|---|---|
| *G11B 20/18* | (2006.01) | |
| *H03M 13/35* | (2006.01) | |
| *H04L 1/00* | (2006.01) | |
| *H04L 1/18* | (2006.01) | |
| *H04L 25/14* | (2006.01) | |
| *H04B 7/26* | (2006.01) | |
| *H04L 1/16* | (2006.01) | |

(52) U.S. Cl.
CPC .. *H04L 25/14* (2013.01); *H04B 2201/709709* (2013.01); *H04L 1/1607* (2013.01); *H04L 1/1809* (2013.01); *H04L 1/1835* (2013.01)

(56) References Cited

U.S. PATENT DOCUMENTS

| | | | | |
|---|---|---|---|---|
| 5,844,918 | A | 12/1998 | Kato | |
| 6,061,820 | A * | 5/2000 | Nakakita | H03M 13/2915 370/395.65 |
| 6,076,181 | A * | 6/2000 | Cheng | H04L 1/1809 370/216 |
| 6,236,647 | B1 * | 5/2001 | Amalfitano | H04L 1/0007 370/230 |
| 6,445,717 | B1 | 9/2002 | Gibson | |
| 6,724,725 | B1 * | 4/2004 | Dreyer | H04L 12/40013 370/231 |
| 7,058,027 | B1 * | 6/2006 | Alessi | H04L 1/0007 370/310.1 |
| 8,068,474 | B2 | 11/2011 | Ferguson et al. | |
| 2002/0071443 | A1 | 6/2002 | Tsukamoto et al. | |
| 2012/0113825 | A1 | 5/2012 | Baglin et al. | |

FOREIGN PATENT DOCUMENTS

| | | |
|---|---|---|
| JP | 05327772 | 12/1993 |
| JP | 06-021923 | 1/1994 |
| JP | 06205068 | 7/1994 |
| JP | 07135494 | 5/1995 |
| JP | 08-502159 | 3/1996 |
| JP | H08502159 | 3/1996 |
| JP | 08-265304 | 10/1996 |
| JP | 09-139727 | 5/1997 |
| JP | 09139727 | 5/1997 |
| JP | 02214474 | 8/1997 |
| JP | 10164073 | 6/1998 |
| JP | 2002538711 | 11/2002 |
| WO | WO-9613914 | 5/1996 |
| WO | WO-9859447 | 12/1998 |

OTHER PUBLICATIONS

Office Action from Norwegian Application No. 20014279 dated Jan. 23, 2013, 3 pages.
Office Action from Norwegian Application No. 20014279 dated Jul. 6, 2012, 1 page.
Notice of Allowance from U.S. Appl. No. 13/284,070 dated Jan. 9, 2013, 7 pages.
Office Action from Japanese Application No. 2011-280151 dated Apr. 9, 2013, 2 pages.
Office Action from Norwegian Application No. 20014279 dated Jul. 26, 2013, 2 pages.
Final Office Action from Japanese Application No. 2011-280151 dated Oct. 13, 2013, 2 pages.
Office Action from Canadian Application No. 2781631 dated Sep. 26, 2013, 2 pages.
Office Action from Japanese Application No. 2012-268281 dated Feb. 4, 2014, 4 pages.
Final Notice of Reasons for Rejection dated Dec. 2, 2014 (+ English translation), in Japanese Patent Application No. 2012-268281, 6 pages.
Non-Final Office Action for U.S. Appl. No. 13/859,254 dated Mar. 12, 2015, 27 pages.
Final Office Action for U.S. Appl. No. 13/859,254 dated Jun. 24, 2015, 33 pages.
Notice of Allowance for U.S. Appl. No. 13/859,254 dated Nov. 24, 2015, 13 pages.
Office Action from Canadian Application No. 2,876,481, dated Mar. 10, 2016, 3 pages.
Office Action from Japanese Application No. 2011-133097, dated Aug. 7, 2012, 5 pages.
Office Action from Japanese Application No. 2011-133097, dated Jan. 20, 2012, 3 pages.
Office Action from Japanese Application No. 2015-075785, dated Apr. 12, 2016, 7 pages.

\* cited by examiner

VARIABLE RATE CODING FOR ENABLING HIGH PERFORMANCE COMMUNICATION

CLAIM OF PRIORITY

This continuation application is related to, and claims priority to, the non-provisional U.S. Utility Patent Application entitled "VARIABLE RATE CODING FOR ENABLING HIGH PERFORMANCE COMMUNICATION," filed Apr. 9, 2013, having an application Ser. No. 13/859,254; this continuation application is related to, and claims priority to, the non-provisional U.S. Utility Patent Application entitled "VARIABLE RATE CODING FOR ENABLING HIGH PERFORMANCE COMMUNICATION," filed Oct. 28, 2011, having an application Ser. No. 13/284,070, which issued as U.S. Pat. No. 8,437,329 on May 7, 2013; this continuation application is related to, and claims priority to, the non-provisional U.S. Utility Patent Application entitled "VARIABLE RATE CODING FOR ENABLING HIGH PERFORMANCE COMMUNICATION," filed Nov. 1, 2010, having an application Ser. No. 12/917,008, which issued as U.S. Pat. No. 8,068,474 on Nov. 29, 2011; this continuation application is related to, and claims priority to, the non-provisional U.S. Utility Patent Application entitled "VARIABLE RATE CODING FOR ENABLING HIGH PERFORMANCE COMMUNICATION," filed Sep. 21, 2009, having an application Ser. No. 12/563,466, which issued as U.S. Pat. No. 7,826,437 on Nov. 2, 2010; and this continuation application is related to, and claims priority to, the non-provisional U.S. Utility Patent Application entitled "VARIABLE RATE FORWARD ERROR CORRECTION FOR ENABLING HIGH PERFORMANCE COMMUNICATION," filed Mar. 5, 1999, having an application Ser. No. 09/263,358, which issued as U.S. Pat. No. 7,593,380 on Sep. 22, 2009, the entire contents of each being incorporated herein by reference.

BACKGROUND OF THE INVENTION

The widespread availability of personal computers at low cost has led to a situation where the public demands access to the Internet and other computer networks at the lowest possible cost. This demand is being transferred to the need to also provide network access for portable devices such as laptop computers, personal digital assistants, and the like. Users of such portable devices even now expect to be able to access such computer networks with the same convenience that they have grown accustomed to when using wire line connections.

Unfortunately, there is still no widely available satisfactory solution for providing low cost wireless access to the Internet at high speed. At the present time, the users of wireless modems that operate with the existing cellular telephone network often experience a difficult time when trying to, for example, view Web pages. This is at least in part due to the fact that the architecture of cellular telephone networks was originally designed to support voice communication and not the packet-oriented data communication protocols in use for the Internet. In addition, the protocols used for connecting users of wide area networks do not lend themselves to efficient transmission over wireless interfaces.

Certain protocols have been proposed that provide multiple data links over a wireless communication system such as one that uses code division multiple access (CDMA). For example, one such system was described in our co-pending United States patent application entitled "A Protocol Conversion and Bandwidth Reduction Technique Providing Multiple nB+D ISDN Basic Rate Interface Links Over a Wireless Code Division Multiple Access Communication System," Ser. No. 08/992,759 filed Dec. 17, 1997 and assigned to Tantivy Communications, Inc., the assignee of the present application. With such techniques, high speed data service can be provided over digital cellular connections through a more efficient allocation of access to the wireless channels. In particular, a number of sub-channels are defined within a standard CDMA channel bandwidth, such as by assigning a different code to each sub-channel. The instantaneous bandwidth needs of a given connection are then met by dynamically allocating multiple sub-channels on an as-needed basis for each session. For example, sub-channels can be granted during times when the subscriber bandwidth requirements are relatively high, such as when downloading Web pages. The bandwidth is then released during times when the content is relatively light, such as when the user is reading a previously downloaded Web page.

However, to implement such a system requires careful planning of various modulation and coding schemes in order to accomplish the maximum possible bit rate while minimizing the effects of noise, multipath, and other sources of errors. For example, modulation codes and pseudorandom spreading codes must be carefully selected to minimize interference among channels occupying the same radio frequency carrier. In addition, it is necessary for framing bits to be inserted in data streams so that higher layered data protocols such as transmission control protocol/Internet protocol (TCP/IP) communication can take place.

SUMMARY OF THE INVENTION

Statement of the Problem

While the above-mentioned systems work well in relatively noise-free environments, they are not optimal in certain respects.

For example, although a cyclic redundancy check (CRC) error can indicate that a TCP/IP frame is received in error, use of a CRC is not optimum in that reception of an erroneous frame requires retransmission of the entire frame. Unfortunately, access techniques which require retransmission are particularly troublesome in shared access wireless environments such as CDMA where access must be specifically granted to accommodate the retransmission. For example, in CDMA systems, the errors can actually have a non-linear effect, reducing system capacity by an amount which is greater than the retransmission bandwidth. It is therefore desirable to minimize the need to retransmit data as much as possible.

Certain techniques known as forward error correction (FEC) are generally used with CDMA and other multiple access modulation schemes applied to voice transmission. Such techniques accept a group of bits, or "block," to be sent over a wireless channel and then, according to sophisticated mathematical algorithms, determine values for additional redundant bits. The number of redundant bits may be quite significant. For example, it is common to use so-called one-half rate, one-third rate, or even one-quarter rate codes whereby the number of bits in a block actually transmitted increases by a factor of two three, or four respectively.

The forward error correcting code can therefore be used to not only detect that a particular string of bits has been received in error, but also to implement error correction. This eliminates the need to retransmit an entire packet due to an error in one or more bits. Forward error correction has thus been widely used in implementations such as satellite broadcast where retransmission is impractical and/or expensive.

Unfortunately, implementation of forward error correction leads to lower overall throughput as measured by the number of packets transmitted per megahertz of available channel bandwidth. In addition, the need to obtain the best error performance typically dictates that a relatively large block size be used for the highest performance algorithms. Implementation of such error correction algorithms therefore incurs latencies in that the entire block must be available at the receiver before it can be decoded. In addition, if an error is detected which cannot be recovered through the forward error correction process, additional latencies are incurred while the block is retransmitted.

DETAILED DESCRIPTION

The present invention is implemented using a protocol converter disposed between the physical communication layers, such as may be associated with implementing a wireless communication protocol, and a network layer, such as may be associated with implementing a network communications protocol.

Briefly, in the present invention, the protocol converter on the transmitter side first splits a network layer frame, such as a TCP/IP frame, into smaller portions referred to as segments. The segment size is variable in length according to an observed error rate. A minimum segment size, for example, is two bytes and a maximum segment size is 512 bytes in a preferred embodiment. All segments across a frame are equal in size.

Information is then added to each of the segments to permit their reassembly into the frame at the receiver. In particular, a segment position number is added to permit the segment to be placed into the proper position when reconstructing the network layer frame at the receiver.

At this point, the segments are arranged into groups referred to herein as blocks. A forward error correction (FEC) algorithm is then applied to the block as a whole. In a preferred embodiment, a block contains 1331 information bits. Therefore, using a one-third rate code, the FEC encoding process provides an output FEC block of 4096 bits.

The protocol also preferably makes use of multiple physical layer connections referred to herein as sub-channels to transmit the encoded FEC blocks at an overall desired transmission rate. The FEC block is then split among the allocated sub-channels such as on a bit-by-bit basis. The bits comprising the FEC block are then sent over the sub-channels. In this case, a link sequence identifier may typically also be added to identify the order in which the outgoing blocks are sent over the sub-channels.

On the receiver side, which in effect includes a protocol converter that performs the inverse function, bits received over the various sub-channels are first assembled into an FEC block. The FEC block, in the preferred embodiment as a block of 4096 bits, are then presented to the inverse FEC algorithm to strip off the redundant code bits and perform error correction.

The output of the FEC decoding process is then split into segments. The cyclic redundancy check information within each segment is then compared to determine whether a particular segment was received in error. If this is the case, then a request is made to retransmit the erroneously received segment.

Eventually, the received segments are reassembled into a complete network layer frame.

The protocol converters at both the transmitter and receiver ends may also dynamically adjust the size of the segments based upon an observed received segment error rate in order to optimize overall throughput. For example, at the receiver side, a segment with the bad cyclic redundancy check (CRC) is discarded and counted as a "bad" segment. By keeping track of the sequence numbers of the received segments, the receiver can determine that a particular segment, namely a segment with a sequence number between the last good segment and the next good segment is missing. The receiver then can explicitly request retransmission of the bad segment by sequence number. This so-called selective reject feature permits both the receiver and the transmitter to know the number of frames received in error from the tally of selectively rejected segments.

From the count of the number of frames sent and the number of selective reject orders received over a given radio channel, the transmitter can then dynamically adjust the size of later transmitted segments for that channel. Preferably, the segment size is adjusted based upon a formula that depends upon the ratio of total number of data bits transferred to the number of bits successfully used to carry information.

By performing forward error correction on a group of segments, rather than on individual segments, the channel bandwidth allocations can thus remain optimized.

The invention is particularly advantageous in an environment which requires the use of packet-oriented protocols such as TCP/IP. Because the number of channels needed to carry a single data stream can be varied efficiently, burst rates can also be efficiently adapted.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis being instead placed upon illustrating the principles of the invention.

DETAILED DESCRIPTION OF A PREFERRED EMBODIMENT

Figure 1:
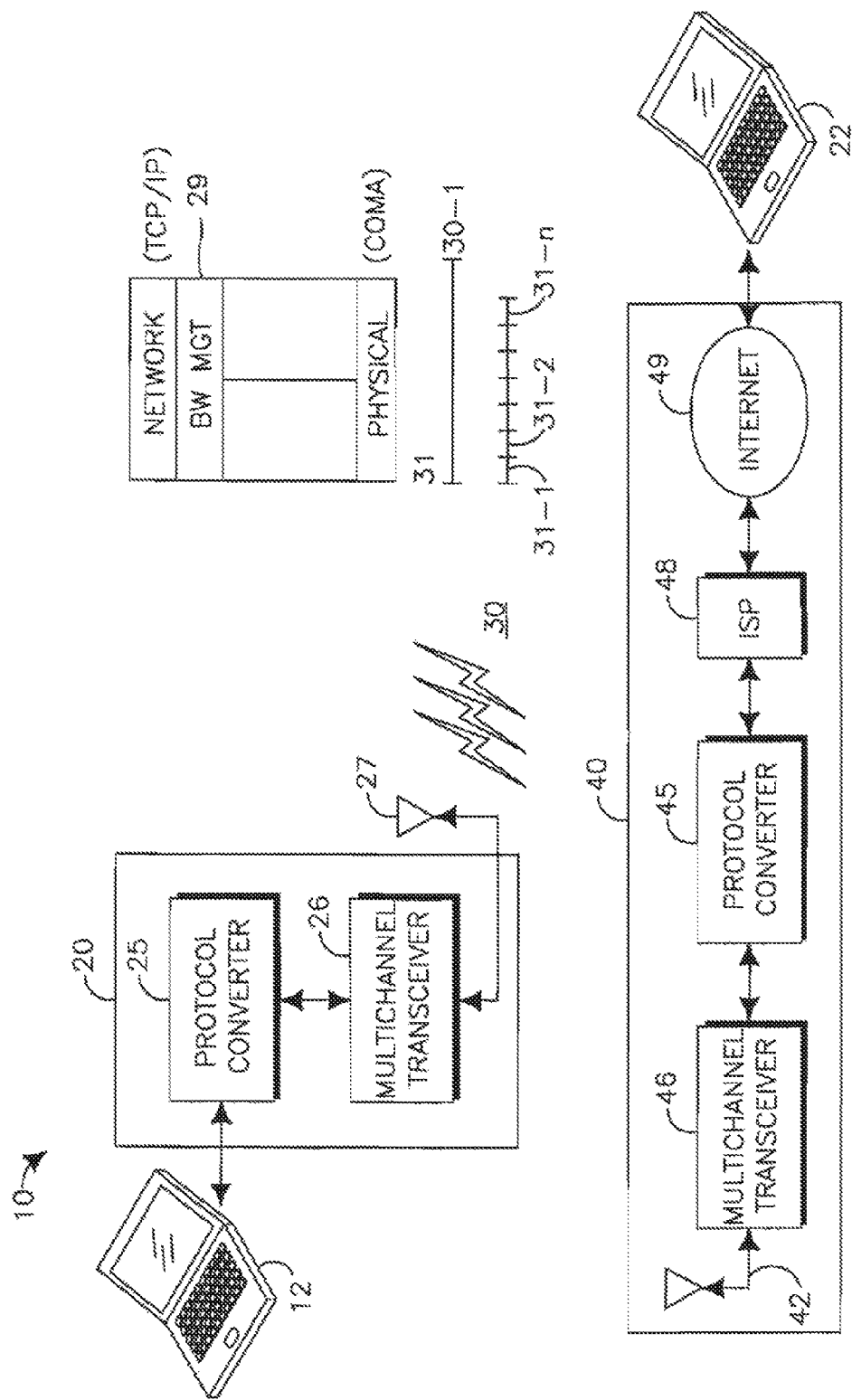
FIG. 1 is a block diagram of a system in which a portable data processing device uses a protocol converter according to the invention to connect to a network.

Turning attention now to the drawings more particularly, FIG. 1 is a block diagram of a system 10 for providing high speed data communication service according to the invention. The system 10 consists of a remote subscriber unit 20, multiple bidirectional communication links 30, and a local or service provider unit 40.

The subscriber unit connects to terminal equipment 12, such as a portable or laptop computer, hand held personal digital assistant (PDA), or the like. The subscriber unit 20 includes a protocol converter 25 which in turn provides data to a multichannel digital transceiver 26 and antenna 27.

The protocol converter 25 receives data from the computer 20, and together with appropriate hardware and/or software, converts it to a format suitable for transmission such as in accordance with known communication standards.

The protocol converter 25 implements an intermediate protocol layer that coverts the data to a format appropriate for use by the multichannel transceiver 26 according to the invention. As will be described in much grater detail below, at a network layer, the data provided by the protocol converter 25 is preferably formatted in a manner consistent with suitable network communication protocols, such as TCP/IP, to permit the terminal equipment 12 to connect to other computers over networks such as the Internet. This description of the protocol converter 25 and protocols is exemplary only and it should be understood that other network layer protocols can be used.

The multichannel digital transceiver 26 provides access to one or more physical communication links such as the illustrated radio channels 30. The physical links are preferably further encoded using known digital multiplexing techniques such as Code Division Multiple Access (CDMA) to provide multiple traffic on a given radio channel 30 or sub-channels 31. It should be understood that other wireless communication protocols may also be used to advantage with the invention.

The communications channels may be implemented by providing multiple coded sub-channels 31 on a single wide bandwidth CDMA carrier channel 30 such as having a 1.25 MegaHertz bandwidth. The individual channels are then defined by unique CDMA codes. Alternatively, the multiple channels 31 may be provided by single channel physical communication media such as provided by other wireless communication protocols. What is important is that the sub-channels 31 may be adversely effected by significant bit error rates that are unique to each radio channel 30.

The service provider equipment 40 includes an antenna 42, a multichannel transceiver 46, a protocol converter 45, and other interface equipment 48 such as modems, bridges, gateways, routers, and the like, which are needed to provide connections to the Internet 49 or other network.

At the service provider 40, the multichannel transceiver 46 provides functions analogous to the multichannel transceiver 26 of the subscriber unit, but in an inverse fashion. The same is true of the protocol converter 45, that is, it provides inverse functionality to the protocol converter 25 in the subscriber unit 20. Data is accepted from the protocol converter 45 in the TCP/IP frame format and then communicated to the Internet 49. It should be understood that the configuration of the remaining equipment 40 may take any number of forms such as a local area networks, multiple dial up connections, T1 carrier connection equipment, or other high speed communication links to the Internet 49.

Turning attention now to the protocol converters 25 and 45 more particularly, they provide bandwidth management functionality 29 implemented between a physical layer such as provided by the CDMA protocol in use with the multichannel transceivers 26 and a network layer protocol such as TCP/IP providing connections between the terminal equipment 22 and the network 49.

The bandwidth management function 29 performs a number of tasks in order to keep both the physical layer and network layer connections properly maintained over multiple communication links 30. For example, certain physical layer connections may expect to receive a continuous stream of synchronous data bits regardless of whether terminal equipment at either end actually has data to transmit. Such functions may also include rate adaption, bonding of multiple channels an the links, spoofing, radio channel setup and teardown. The details for implementing a protocol converter specifically for ISDN terminal equipment 22 and Code Division Multiple Access (CDMA) modulation techniques in use by the multichannel transceiver 26 are more specifically described in a pending patent application by Thomas E. Gorsuch and Carlo Amalfitano, entitled "A Protocol Conversion and Bandwidth Reduction Technique Providing Multiple nB+D ISDN Basic Rate Interface Links Over A Wireless Code Division Multiple Access Communication System," filed Dec. 17, 1997 and given Ser. No. 08/992,759, which is assigned to Tantivy Communications, Inc., the assignee of the present application, and which application is hereby incorporated by reference.

The present invention is more particularly concerned with the techniques used by the protocol converters 25 and 45 for formatting the data to be transmitted over implementing multiple logical sub-channels 31-1, 31-2, . . . , 31-n each of the multiple radio channels 30 in order to improve the effective throughput rate between a transmitter and a receiver in a bit error rate prone environment. It should be understood in the following discussion that the connections discussed herein are bidirectional, and that a "transmitter" may either be the subscriber unit 22 or the service provider unit 40.

In addition, an "error" as described herein is a bit error perceived at the higher layer such as the network layer. The invention only strives to improve the overall system level bit error rate, and does not attempt to guarantee absolute data integrity.

Figure 2:
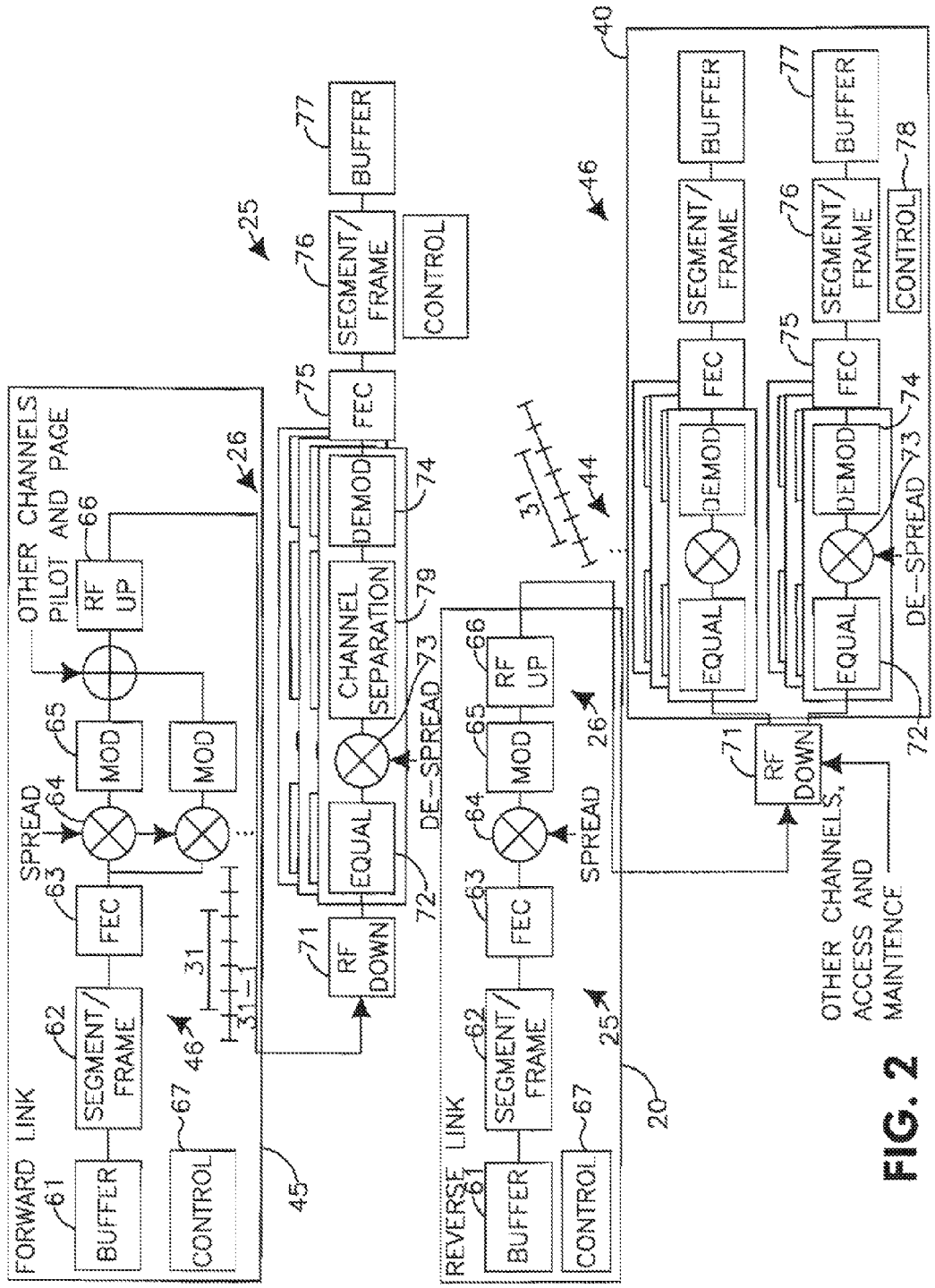
FIG. 2 is a more detailed diagramming depicting the architecture of the protocol converter and multichannel transceiver.

Turning attention now to FIG. 2, there is shown in more detail a block diagram of a forward link and reverse link implemented according to the invention, more particularly showing the protocol converter 25 and multichannel transceiver 26 associated with the subscriber side unit and the multichannel transceiver 46 and protocol converter 44 associated with the service provider unit 40.

Beginning with the lower portion of the diagram in the reverse link direction, that is, in the direction of transmission from the subscriber unit 20 to the service provider unit 40, the reverse link protocol converter 25 consists of a buffer 61, segment framer 62, and forward error correction (FEC) unit 63. The multichannel transceiver 26 consists of a pseudonoise (PN) code generator 64, modulator 65, and radio frequency (RF) up converter 66. The buffer 61 receives input data in a manner which will be described in more detail further. Segment framer 62 arranges data received from the buffer in an appropriate format to be fed to the FEC unit 63. The FEC unit 63 applies a forward error correction algorithm to the data using a known error correction technique such as Reed Solomon, Turbo Codes, or other codes.

The transceiver 66, in this instance using it as a transmitter, spreads the resulting data by the PN sequence, modulates the PN spread data with appropriate channel coding per the assigned sub-channels 31, and the up converts the result to the desired radio frequency.

On the receive side of the reverse link, that is, at the service provider 40 side, the transceiver 44 performs a receiver function. In this instance, the RF down converter 71 feeds multiple receiving units that each include an equalizer 72, a PN code despreader 73, and demodulator 74. Each demodulated output is provided to a protocol converter block that includes an FEC decoder 75, an inverse segment framer 76, and buffer 77. A controller 78 may be used to control and/or implement each of the protocol converter functions as described in further detail below.

In the preferred embodiment, the FEC decoder 75 makes use of a so-called trellis decoder. Because a trellis decoder is a type of decoder which compares multiple bits in groups to arrive at an estimate of the correct received bits, when a trellis decoder does produce errors, they tend to occur in groups.

The analogous functions are provided on the forward link. In this instance, the protocol converter 45 receives input data, processing it through a buffer 61, segment framer 62, and FEC unit 63. The transceiver 46 performs a transmitting function over multiple sub-channels 31, including multiple spreaders 64, modulators 65, and RF up converters 66.

On the receiver side of the forward link, the inverse process is provided by an RF down converter 71, equalizer 72, despreader 73, and channel separator 79 and demodulator 74 for each channel. Forward error correction unit 75, segment framer 76, and buffer 77 complete the implementation of the protocol converter 25.

Figure 3:
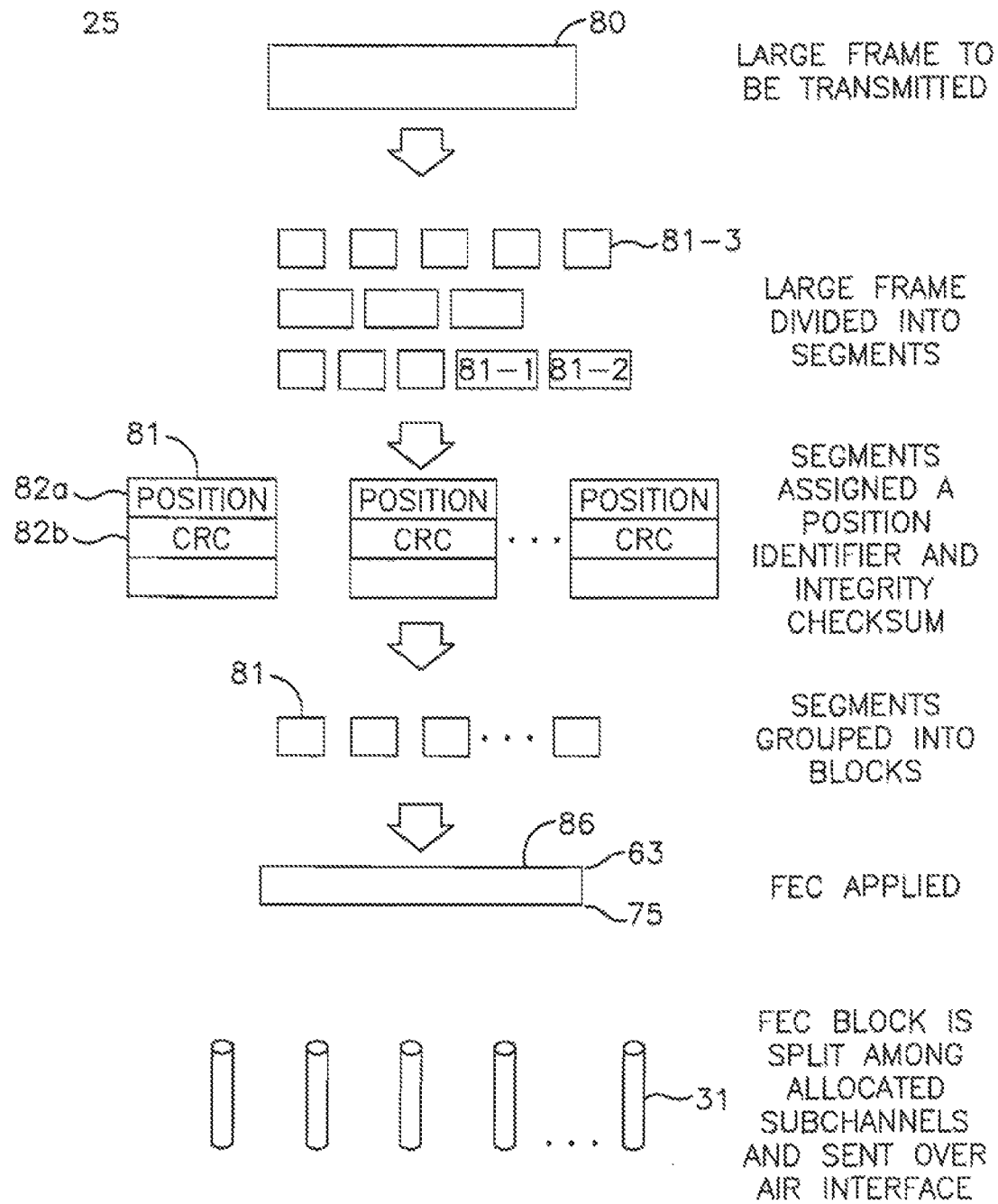
FIG. 3 is a diagram illustrating how network layer frames are divided into segments by a protocol converter located at a transmitter.

Turning attention now more particularly to FIG. 3, the operations of an exemplary protocol converter 25, at the transmit side will briefly described. As shown, an input frame 80 as received from the network layer is relatively large, such as for example 1480 bits long, in the case of the TCP/IP protocol.

The input frame 80 is first divided into a set of smaller pieces or segments 81-1, 81-2. The size of the individual segments 81 are chosen based upon an optimum segment length determined for each of the channels 30. For example, a bandwidth management function may make only a certain number of sub-channels 31 available at any time. A subset of the available sub-channels 31 is selected, and then the optimum number of bits for each segment intended to be transmitted over respective one of the sub-channels, is then chosen. Thus as illustrated in the figure, a given frame 80 may be divided into segments associated with four sub-channels 31. At a later time, there may be nine sub-channels 31 available for a frame, with different optimum segment sizes for the segment 81-2.

An optimum subframe size can thus be determined for each channel 30 for these parameters described in our previously referenced co-pending patent application. In the preferred embodiment, for example, this is set equal to $$X = -H + \sqrt{(X_{current} + H_{current}) \times \frac{H}{R}}$$

where H is the frame overhead in bytes, including any shared frame synchronization flags (7e) between subframes, $X_c$ is a current number of data bytes assigned to a subframe, $H_c$ is the current frame overhead, and R is the observed subframe error ratio.

In the preferred embodiment, the segment size is the same for segments 81 associated with each associated radio channel 30 and frame 80 to minimize overhead, although that is not an absolute requirement.

After the frame 80 is divided into segments 81, each of the segments 81 has additional information appended to it. For example, each of the segments 81 consists of at least a position identifier 82a and an integrity check sum such as in the form of a cyclic redundancy check (CRC) 82b. Position identifier 82a serves to indicate the position of each segment 81 within its associated large frame 80. The integrity check sum 82b serves to permit the receiver to determine whether particular segments 81 are received in error.

The segments 81 are then further prepared for transmission over each sub-channel 31. In particular, the segments 81 are next grouped into blocks 86. The number of segments in each block 86 is selected to a convenient number depending upon the forward error correction 63, 75 to be applied. For example, in a preferred embodiment, forward error correction block 86 consists of a sufficient number of segments 81 to total 1331 bits. If the FEC algorithm being applied is a one-third rate code, this results in a FEC block 86 length of 4096 bits. Finally, the FEC block 86 is divided among the sub-channels 31 allocated to the particular connection and transmitted.

Figure 4:
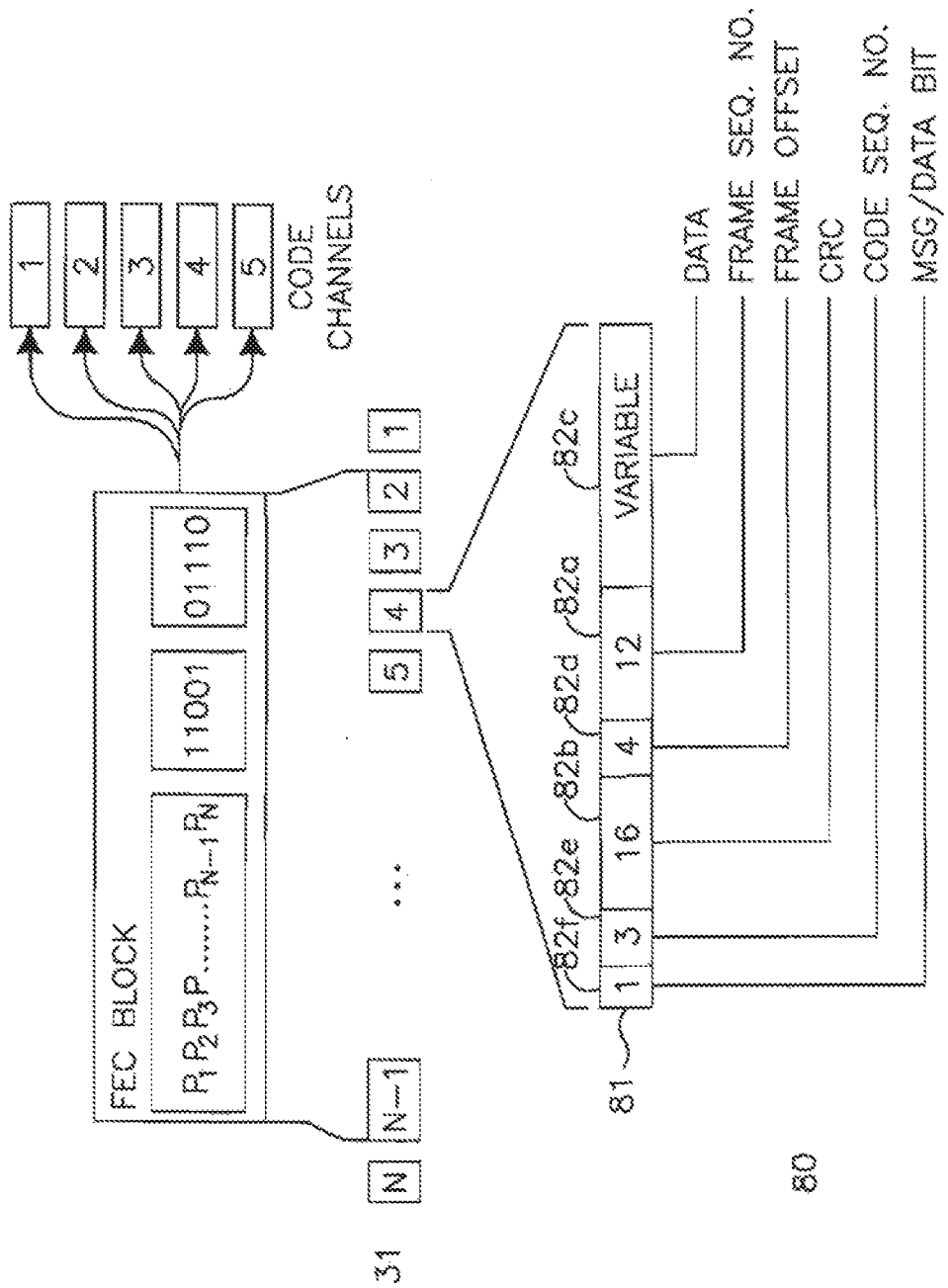
FIG. 4 is a detailed diagram of an individual segment and how multiple segments are assembled into a forward error correction block.

FIG. 4 is a more detailed view of the format of a segment 81. Segment 81 consists of a number of fields, including the position field 82a and the CRC field 82b previously mentioned. A number of other fields are also evident in the exemplary segment 81. In particular, there is a data field 82c which carries the associated source data taken from the input large frame 80. This data field 82c is a variable size and can be changed according to optimized parameters as specified by an observed error rate. In a preferred embodiment, the number of data bits may vary from 2 up to 512 in a given segment 81 depending upon observed error rates. As previously mentioned, all segments across a given input frame 80 are selected to be equal in size, e.g., they have an equal sized data field 82c.

Furthermore, while a given input frame will be transmitted over multiple sub-channels 31, it will only be divided into segments which are to be transmitted over a given radio channel 30.

In addition, a frame offset field 82d may be used to identify which of a number of frames each segment 81 pertains to. This frame offset field is of particular use because of latencies involved in the system. In particular, segments 81 are not necessarily guaranteed to arrive at the receiver in the same order as they were transmitted. Furthermore, if particular segments 81 are received in error, it may be necessary to request retransmission. Therefore, it is possible that segments 81 associated with more than one block need to be operated upon at the receiver at a given time. The frame offset field 82d therefore permits the receiver to distinguish which large frame 80 each segment 81 belongs to.

A code sequence field 82e may be used to identify a sequence number related to each sub-channel 31 at the beginning of each frame. This permits lower order channel processing to route segments 81 more efficiently.

Finally, a message data field 82f may be used to indicate whether the segment 81 contains source data, i.e., active traffic data, or control information for the intended recipient.

Figure 5:
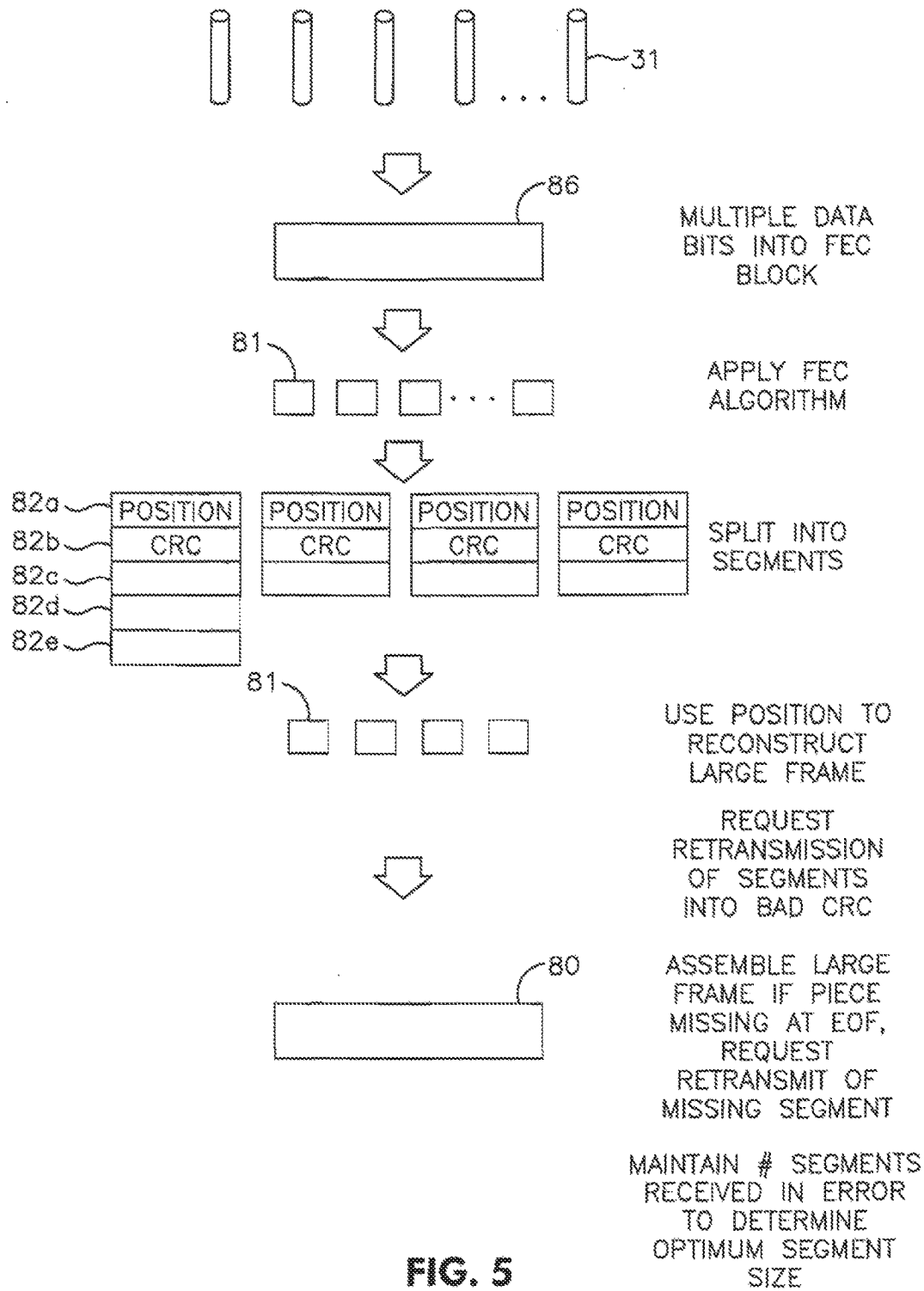
FIG. 5 is a diagram illustrating how a protocol converter at a receiver reassembles the network layer frames.

FIG. 5 illustrates the operations performed at the receiver side. Data bits received from the multiple sub-channels 31 are first collected in order to reconstruct the FEC block 86.

Next, the FEC algorithm is applied to detect and correct one or more bits using error correction coding. The resulting information is split into segments 81 using the known segment size. The segments 81 are then examined and the position field 82 is used to reconstruct the large frame 80.

Any segments 81 that are missing can thus be detected by comparing the received position fields 82a. If a sequence position field in a frame in a particular position or particular sequence number 82e is missing, it is assumed that the associated segment 81 was not received. It should be understood that appropriate buffering of data and segments 81 is typically required in order to properly receive the segments 81 and determine if any are missing. The buffer size will depend upon the transmission rates, number of sub-channels 31, and propagation delays in effect.

Upon detection of a missing segment 81, retransmission of the missing segment 81 is requested by the receiver. At this point, the transmitter re-performs transmission of the missing segment 81. Once all of the segments 81 in a particular large frame 80 are received, the position information 82a can then be used to arrange the data from the segments 81 in the proper order to reconstruct the original large frame 80.

At this point, if any piece of the large frame 80 is still missing such as when an end of frame command is encountered, retransmission of the corresponding segment 81 can be requested at the indicated position, specifying a length for the missing piece.

Because of the use of both the position field 82a and sequence field 82e, both the transmitter and receiver know the ratio of the number of subframes 81 received with errors to the number of subframes 81 received without errors. Also, the receiver and transmitter know the average subframe length for each channel.

Figure 6:
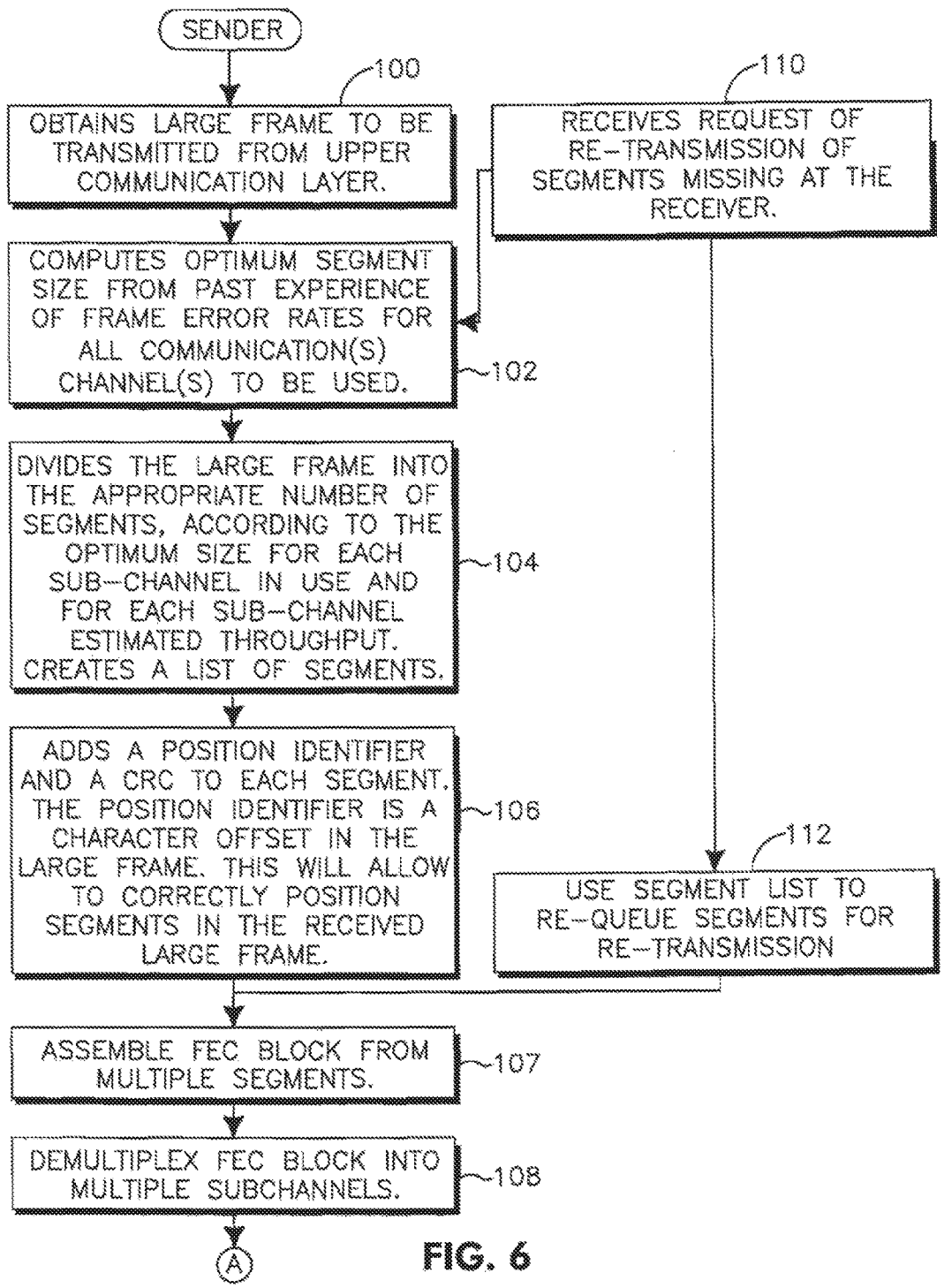
FIG. 6 is a series of steps performed by a protocol converter located at the transmitter to implement the invention.

FIG. 6 is a detailed flow diagram of a set of operations performed by the transmitter in order to implement the invention. In a first state 100, the large frame 80 is obtained from an upper communication layer such as the network layer. In a next state 102, the transmitter computes an optimum segment size from past observations of frame error rates on the individual sub-channels 81, preferably calculating an optimum segment size for all communication channels available.

In a next state 104, the network layer frame 80 is divided into an appropriate number of segments 81 according to the optimum size for each associated sub-channel available. This division is also based upon the available sub-channel estimated throughput. A list of segments is then created.

In a next state 106, a position identifier and a cyclic redundancy check (CRC) code is added to each segment 81. The position identifier offset within the large frame 80, as described above, is then added to allow correct positioning of the segment 81 when reconstructing the frame 80 at the receiver end.

Next, an FEC block 86 is assembled from the multiple segments 81. Following that, in state 108, the FEC block 86 is demultiplexed and the bits in the FEC block are assigned to respective ones of the multiple sub-channels 31.

When the transmitter receives a retransmission request for a segment 81 missing at the receiver, a state 110 is entered in which an optimum segment size is computed from the observed frame averages for the available communications sub-channels 31. The segment list is then used to requeue the segment for retransmission in state 112. Processing then continues at state 108 for retransmission of the missing segment 81.

Figure 7:
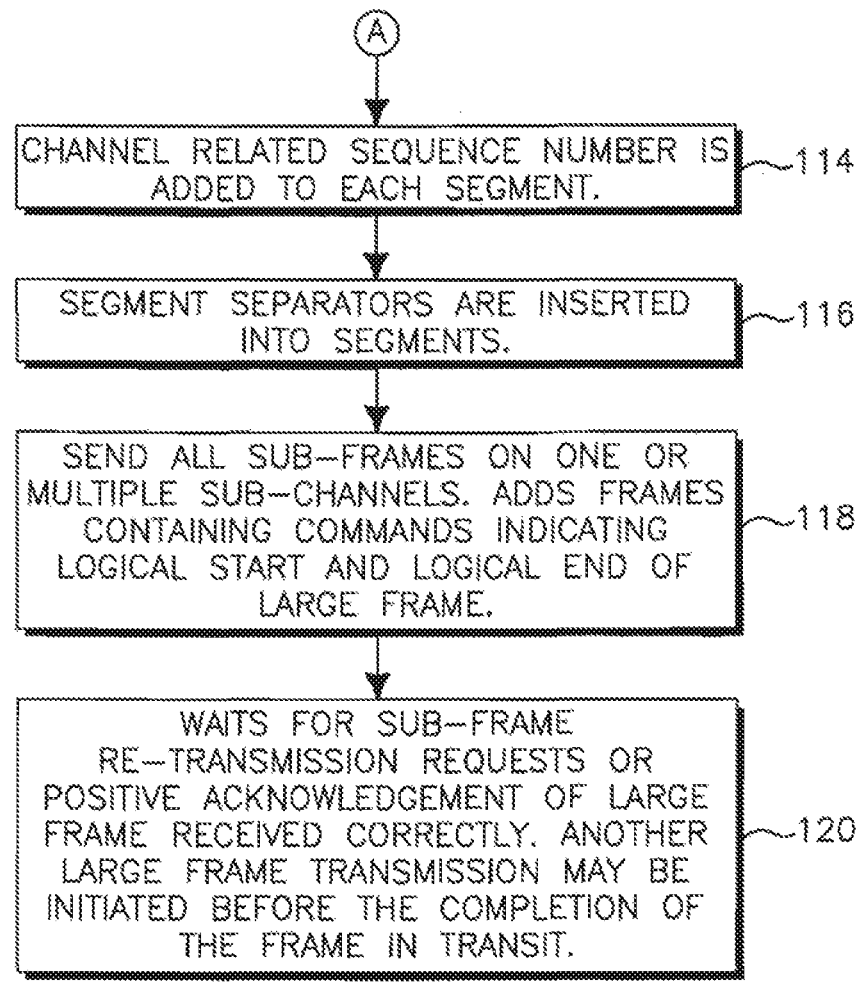
FIG. 7 is a continuation of the diagram of FIG. 6.

FIG. 7 shows the remainder of the steps performed at the transmitter. In a state 114, a channel-related sequence number is added to each segment 81. In a next state 116, segment separators such as flags in the form "7E" are inserted into the segments. In addition, any zero insertion such as mandatory setting of a data bit to a 1 after a sequence of five zeros, is performed. Other synchronization, separation, and coding techniques may require that bits be inserted into the segments 81 at this point. For example, a given channel 30 may make use of convolutional coding as specified by the IS-95 standard, and if so, this is performed here.

In a next state 118, the segments 81 are sent over the available channels 31. Non-data frames such as logical start, logical end and other control frames may be inserted at this point as well.

In a final state 120, the transmitter operates on any segment retransmission requests or positive acknowledgments of a large frame being received correctly. Another frame transmission may be initiated, for example, at this point before completion of a frame in transit.

Figure 8:
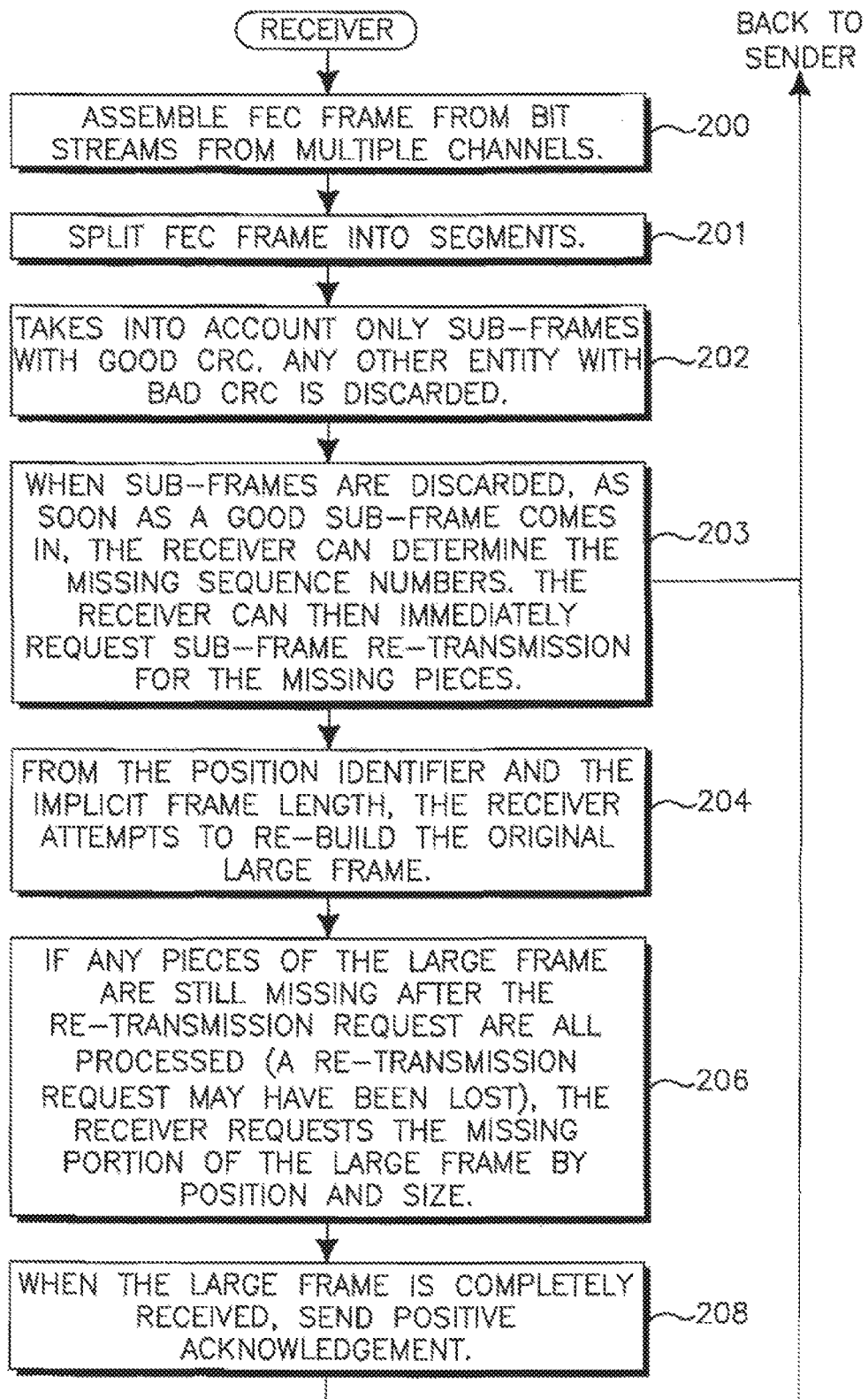
FIG. 8 is a diagram of the steps performed by a protocol converter located at a receiver to implement the invention.

FIG. 8 shows a detailed sequence of the steps performed at the receiver. In a first state 200, a received FEC frame 86 is assembled from the bit streams taken from multiple sub-channels 31. In the next state 201, the FEC frame is then split into segments 81 according to the current segment size.

In the next state 202, the subframes 81 are examined. Any segment with a good CRC is passed to the next following state 203. Any other received segment 81 with a bad CRC is discarded.

Continuing with state 203, the receiver determines any missing sequence numbers. The receiver then requests retransmission of segments 81 for the missing pieces based upon sequence number by sending back a retransmission request to the transmitter.

In a next state 204, from the position identifier and the known length of each original large frame 80, the receiver attempts to rebuild the original frame 80. In state 206, if any pieces of the frame 80 are still missing after the retransmission requests are all processed, accommodating the fact that a retransmission request itself may be lost, the receiver requests the missing portion of the large frame 80 by position and size.

In state 208, once the frame 80 is completely received, a positive acknowledgment is returned back to the transmitter.

It can now be understood that by applying the sub-channel segmentation step first, prior to error correction encoding, the full benefit of the error correction code is obtained while minimizing the amount of data that needs to be re-transmitted. In particular, because bit errors in the output of the trellis-implemented FEC decoder 75 tend to occur together, they will also therefore tend to affect a single segment 81.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:
1. A portable device, comprising:
a processor;
a transmitter;
a receiver;
wherein the processor is to segment a first data unit to produce a plurality of segments, wherein the processor is to segment the first data unit according to size information received from a lower layer;

wherein the processor is to further append information to each segment, the information comprising a first field, a second field, and a third field, wherein the processor to append information to each segment is operable to add information to each segment of a plurality of segments to produce a plurality of segmented packet data units;

wherein the first field is used to indicate whether the third field includes control data or traffic data;

wherein the second field is used to identify the first data unit;

wherein the third field is a data field;

wherein the processor is to further combine one or more segments of the plurality of segments to form a second data unit, and further wherein the processor is to further assemble an FEC block from the plurality of segmented packet data units, wherein an FEC algorithm is applied to the FEC block as a whole to form the second data unit;

wherein the transmitter is to transmit the second data unit;

wherein the receiver is to receive a re-transmission request, wherein the re-transmission request indicates the second data unit is missing and further wherein the re-transmission request indicates a missing segment from the second data unit and further wherein the re-transmission request identifies a position of the missing segment; and wherein the processor is to further re-segment the second data unit to form a third data unit and further wherein the re-segmenting is performed according to the size information received from the lower layer.

2. The portable device of claim 1, wherein the information to append to each segment comprises at least the first field and the second field;

wherein information for the first field is used to indicate whether a corresponding segmented packet data unit includes control information or traffic data; and wherein the second field is used to identify a corresponding first packet data unit.

3. The portable device of claim 1, wherein the processor to re-segment the second data unit comprises the processor to de-multiplex the assembled FEC block into bits;

wherein the bits of the FEC block are assigned to respective ones of multiple sub-channels for transmission; and wherein the transmitter is to transmit the second data unit comprises the transmitter to transmit the plurality of segmented packet data units via the multiple sub-channels in the form of the bits de-multiplexed from the FEC block and as assigned to the respective ones of the multiple sub-channels.

4. The portable device of claim 1, wherein the processor to re-segment the second data unit comprises the processor to re-segment a missing segmented packet data unit to form one or more new segmented packet data unit segments.

5. The portable device of claim 1, further comprising:
an antenna; and
a buffer to store the first data unit.

6. Wireless transmission circuitry, comprising:
a processor;
a transmitter;
a receiver;
wherein the processor is to segment a first data unit to produce a plurality of segments, wherein the processor is to segment the first data unit according to size information received from a lower layer;

wherein the processor is to further append information to each segment, the information comprising a first field, a second field, and a third field;

wherein the first field is used to indicate whether the third field includes control data or traffic data;

wherein the second field is used to identify the first data unit;

wherein the third field is a data field;

wherein the processor is to further combine one or more segments of the plurality of segments to form a second data unit;

wherein the transmitter is to transmit the second data unit;

wherein the receiver is to receive a re-transmission request, wherein the re-transmission request indicates either the second data unit is missing or indicates a missing segment from the second data unit;

wherein the processor is to further re-segment the second data unit, wherein the processor is to perform the re-segmentation according to the size information indicated by a lower layer;

wherein the processor is to further assemble an FEC block from the plurality of segmented packet data units; and wherein an FEC algorithm is applied to the FEC block as a whole to form the second data unit.

7. The wireless transmission circuitry of claim 6, wherein the processor to re-segment the second data unit comprises the processor to de-multiplex the assembled FEC block into bits;

wherein the bits of the FEC block are assigned to respective ones of multiple sub-channels for transmission; and wherein the transmitter is to transmit the second data unit comprises the transmitter to transmit the plurality of segmented packet data units via the multiple sub-channels in the form of the bits de-multiplexed from the FEC block and as assigned to the respective ones of the multiple sub-channels.

8. The wireless transmission circuitry of claim 6, wherein the processor to re-segment the second data unit comprises the processor to re-segment a missing segmented packet data unit to form one or more new segmented packet data unit segments.

9. The wireless transmission circuitry of claim 6, further comprising a buffer to store the first data unit.

10. The wireless transmission circuitry of claim 6, further comprising an antenna.

11. Non-transitory software instructions embedded in a non-transitory computer readable medium of a computer hardware that, when executed by a portable device having embedded therein at least a processor, a transmitter, and a receiver, the software instructions cause the processor of the portable device to perform operations comprising:

segmenting a first data unit to produce a plurality of segments;

appending information to each segment to produce a plurality of segmented packet data units, the information comprising a first field, a second field, and a third field;

wherein the first field is used to indicate whether the third field includes control data or traffic data;

wherein the second field is used to identify the first data unit;

wherein the third field is a data field;

combining one or more segments of the plurality of segments to form a second data unit, including assembling, by the processor, an FEC block from the plurality of segmented packet data units, wherein assembling the FEC block comprises applying an FEC algorithm to the FEC block as a whole to form the second data unit;
transmitting, via the transmitter, the second data unit;
receiving, via the receiver, a re-transmission request; and
re-segmenting the second data unit.

12. The non-transitory software instructions embedded in the non-transitory computer readable medium of claim 11, wherein the processor is to segment the data unit according to size information received from a lower layer.

13. The non-transitory software instructions embedded in the non-transitory computer readable medium of claim 11, wherein the re-transmission request indicates the second data unit is missing or indicates a missing segment from the second data unit.

14. The non-transitory software instructions embedded in the non-transitory computer readable medium of claim 11, wherein the re-transmission request identifies a position of the missing segment.

15. The non-transitory software instructions embedded in the non-transitory computer readable medium of claim 11:
wherein re-segmenting the second data unit comprises de-multiplexing the assembled FEC block into bits;
assigning the bits of the FEC block to respective ones of multiple sub-channels for transmission; and
wherein transmitting the second data unit comprises transmitting the plurality of segmented packet data units via the multiple sub-channels in the form of the bits de-multiplexed from the FEC block and as assigned to the respective ones of the multiple sub-channels.

* * * * *